United States Patent [19]

Blanchet-Fincher

[11] Patent Number: 5,192,580
[45] Date of Patent: Mar. 9, 1993

[54] PROCESS FOR MAKING THIN POLYMER FILM BY PULSED LASER EVAPORATION

[75] Inventor: Graciela B. Blanchet-Fincher, Wilmington, Del.

[73] Assignee: E. I. Du Pont de Nemours and Company, Wilmington, Del.

[21] Appl. No.: 916,663

[22] Filed: Jul. 22, 1992

Related U.S. Application Data

[63] Continuation-in-part of Ser. No. 869,651, Apr. 16, 1992.

[51] Int. Cl.[5] .......................................... B05D 3/06
[52] U.S. Cl. ................................ 427/596; 427/255.1; 427/255.6; 427/294
[58] Field of Search .............. 427/53.1, 54.1, 255.1, 427/255.6, 294

[56] References Cited

U.S. PATENT DOCUMENTS 4,915,981  4/1990  Traskos et al. ....................... 427/53

FOREIGN PATENT DOCUMENTS 166358  7/1991  Japan .

OTHER PUBLICATIONS

Mihailov et al., J. Appl. Phys. 69 (7), pp. 4092–4102 (1991).
Dijkkamp et al., Appl. Phys. Lett. 51 (8), pp. 619–621 (1987).
Rimai et al., Appl. Phys. Lett. 59 (18), pp. 2266–2268 (1991).
Znotins, Solid State Technology, pp. 99–104 (1986).

Primary Examiner—Bernard Pianalto

[57] ABSTRACT

A process for producing thin film of a first addition polymer on a substrate comprising bombarding a target, consisting essentially of a second addition polymer, with radiation from a pulsed laser in a vacuum or gas atmosphere to form a plume of components of said second polymer; and depositing said plume on a substrate, whereby a film of said first polymer is formed. The first and second addition polymer may be identical or different and in both cases may be fluoropolymer.

23 Claims, 1 Drawing Sheet

PROCESS FOR MAKING THIN POLYMER FILM BY PULSED LASER EVAPORATION

CROSS-REFERENCE TO RELATED APPLICATION

This application is a continuation in-part of Ser. No. 07/869,651 filed Apr. 16, 1992.

FIELD OF THE INVENTION

This invention relates to manufacture of thin polymer film by a novel pulsed laser evaporation process.

BACKGROUND OF THE INVENTION

The technique of laser evaporation, known in the art as laser ablation, has been applied to a large class of materials ranging from polymers to semiconductors and dielectrics. This technique has been applied extensively to form thin films of inorganic material, such as ceramic oxides exhibiting superconductivity, to fill the demands of the electronics industry for device applications such as radio frequency and microwave technology, see, for example, D. Dijkkamp at al., Appl. Phys. Lett., 51, 619-621 (1987). Oriented silicon carbide films by laser ablation of silicon carbide targets are described by L. Rimai et al., Appl. Phys. Lett. 59 (18), 28 Oct. 1991, pp. 2266-2268, wherein it is noted that the resulting films often contain material other than SiC. Japanese Patent 03166358 describes a method for producing stoichiometric films of inorganic oxide, nitride and carbide by irradiating a target by a laser and depositing the clusters so formed onto a substrate to form a thin film, wherein plasma is generated synchronously with the laser irradiation.

Laser ablation applied to organic materials, particularly polymers, has been confined primarily to etching, i.e., selective removal of polymeric material from a polymeric target to form a patterned surface on the target. For example, the photoetching of polyimide is described by S. Mihailov et al., J. Appl. Phys. 69 (7), 1 Apr. 1991, pp. 4092-4102. Laser ablation of fluoropolymer composite laminates to render the laminates absorptive to ultra violet radiation is described in U.S. Pat. No. 4,915,981.

SUMMARY OF THE INVENTION

This invention provides for a process for producing thin film of a first addition polymer on a substrate by bombarding a target consisting essentially of a second addition polymer, with radiation from a pulsed laser in a vacuum or gas atmosphere (i.e., gaseous fluorocarbon or inert gas) to form a plume of components of said second addition polymer; and depositing said plume on the substrate, whereby a film of said first addition polymer is formed. The first and second addition polymer may be identical or different.

DETAILED DESCRIPTION OF THE INVENTION

Figure 1:
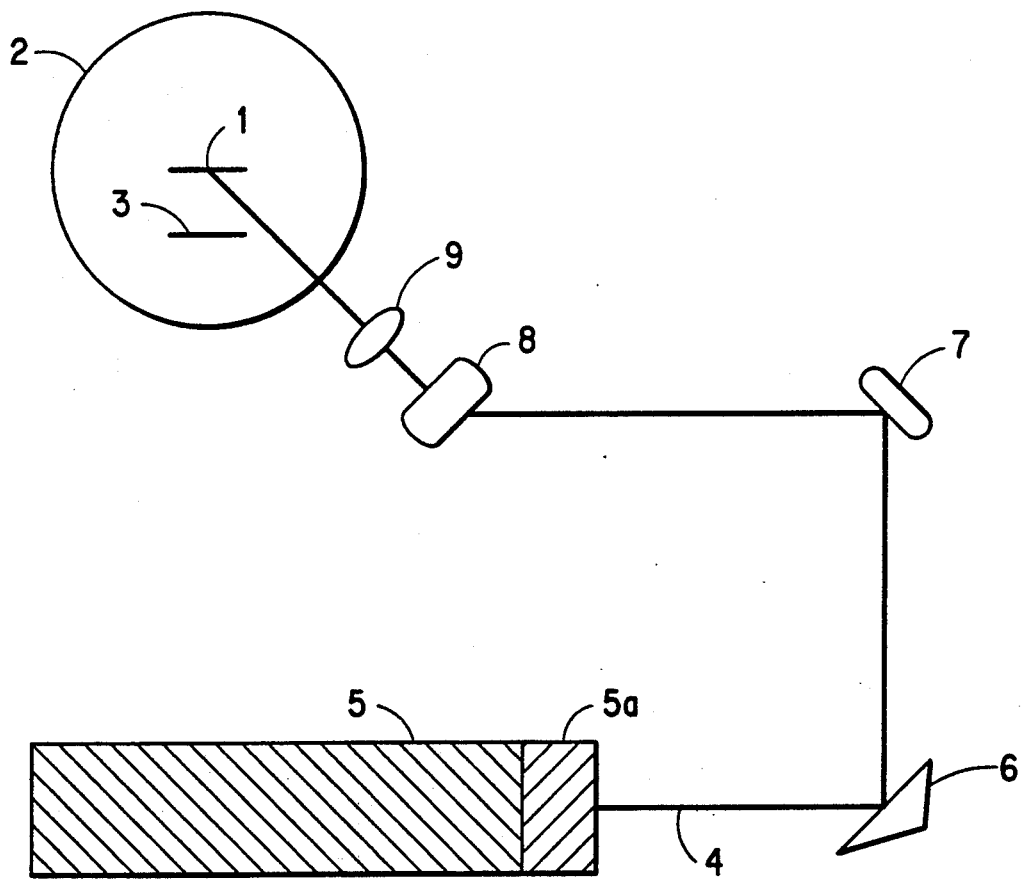
FIG. 1 is a schematic view of an apparatus useful in the practice of this invention.

The target materials used in the practice of this invention consist essentially of addition polymers. Addition polymers are polymers which are formed by radical chain polymerization, i.e., free-radical polymerization as described in Textbook of Polymer Science, John Wiley & Sons, pp. 49-50 (1984). Typical addition polymers are formed from monomers containing at least one ethylenically unsaturated bond. Included within the definition of addition polymers are fluoropolymers, alkylacrylic polymers, and ethylene polymers such as polyethylene.

With the exception of ethylene polymers such as polyethylene, suitable addition polymers will thermally depolymerize to regenerate the monomer or monomers from which they were made to a degree of regenerating preferably at least 70%, more preferably at least 80%, and most preferably at least 90% by weight of the monomer or monomers from which it was made, based on the mole % of the addition polymer. Optionally, but not necessarily, the thermally formed monomer or monomers should reform the original addition polymer upon cooling.

Thermal depolymerization is heating a polymer until it vaporizes into various components as well as decomposition products, see Textbook of Polymer Science, pp. 141-143, John Wiley & Sons (1984).

Addition polymers of choice are formed by free radical polymerization of their monomeric precursor or precursors at the substrate temperatures used in the practice of the process of this invention.

Fluoropolymers are generally those polymers having a carbon backbone and fluorine substituents thereon, said fluorine substituents constituting at least 40% by weight of the polymer. Examples include repeat units of the formulas

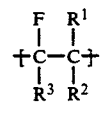 I or

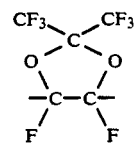 II wherein $R^1$, $R^2$, and $R^3$ are independently selected from fluorine, hydrogen, chlorine, branched or straight chain alkyl or fluoroalkyl of up to 10 carbon atoms, branched or straight chain alkoxy or fluoroalkoxy of up to 10 carbon atoms, branched or straight chain vinylether or fluorovinyl ether of up to 10 carbon atoms or ethylene copolymers thereof, and copolymers with the above repeat units. Preferred fluoropolymers are fluorinated polyethylenes particularly polytetrafluoroethylene; or compounds of Formula I, where $R^1$, $R^2$, or $R^3$ is perfluoromethyl; or compounds of Formula I where $R^1$, $R^2$, or $R^3$ is perfluoropropylvinylether. Preferred copolymers are TEFLON AF 1600® (a copolymer of polytetrafluoroethylene and perfluoro-2,2-dimethyl-1,3-dioxol), TEFLON FEP® (a copolymer of hexafluoropropylene and polytetrafluoroethylene), and TEFLON PFA® (a copolymer of perfluoroalkoxy monomers and tetrafluoroethylene). Alkylacrylic polymers, e.g., alkyl of 1 to 20 carbon atoms, include alkylmethacrylic polymers, and copolymers thereof. Preferred alkylacrylic polymers are poly(methylmethacrylate), poly(ethylmethacrylate) and poly(butylmethacrylate).

It is preferred that the target be as dense as possible consistent with the density achievable by the method of preparation to insure structural integrity of the target. Adequate densities are available commercially. The most convenient form of the target is that of a pellet or disk. If the pellet or disk form is not readily commercially available, polymer pellets or disks can be easily made by pressing commercially available powdered polymer at high pressure, e.g. about 25,000 psi and, optionally high temperature, e.g. about 100° C. above the polymer glass transition temperature. Typical disk size is 2 cm in diameter and 4 mm thick.

The practice of this invention is further illustrated in reference to FIG. 1. The target addition polymer 1, is placed in a vacuum chamber 2 typically 3 cm to 5 cm from the substrate 3 upon which the film is to be deposited. The UV laser beam 4 of a pulsed laser 5 is then transmitted through a plane mirror 7, rastering mirror 8 and lens 9 onto the target addition polymer 1 with a fluence of preferably from about 0.10 to about 3 Joules/cm$^2$-pulse, and more preferably for fluoropolymers at least about 0.4 Joules/cm$^2$-pulse to about 1.5 Joules/cm$^2$-pulse; for alkylacrylic polymers at least 0.1 Joules/cm$^2$-pulse to about 0.5 Joules/cm$^2$-pulse; and for polyethylene at least 0.4 Joules/cm$^2$-pulse to about 1.0 Joules/cm$^2$-pulse. Typical lasers useful in the practice of this invention are a Nd-YAG laser at wavelength 266 nm, fourth harmonic beam thereof, such as Spectra-Physics DCR-11, and KrF or ArF excimer lasers at wavelengths of 248 nm and 193 nm respectively, such as the Lambda Physik EMG 202. When a Nd-YAG laser is used, a harmonic generator 5a and a pellin-broca 6 prism are incorporated into the path as shown in FIG. 1 to generate a UV beam and separate it from the fundamental and second harmonic, respectively. The bombardment of the laser beam 4 on the target addition polymer results in immediate ablation and expulsion of components of said addition polymer, such as the monomer and/or lower molecular weight compositions or fragments of the addition polymer from the target that is deposited on the substrate at the rate of about 0.05 Å to about 1 Å 1/pulse. The substrate for fluoropolymers is maintained at a temperature within about −200° C., e.g. the temperature of liquid nitrogen to about 325° C., preferably between about ambient and about 20° C. For alkylacrylic polymers and polyethylene, the substrate is maintained at a temperature within about ambient to about 200° C. The ablation is preferably conducted in a gas atmosphere, although vacuum deposition is also possible. The preferred atmospheres are argon and fluorocarbon gases under a pressure of about 25-250 millitorr. When fluorocarbon gases are used, it is possible that some fluorocarbon radicals may be formed from the fluorocarbon gas per se and act to further fluorinate the film formed when a fluoropolymer is used as the target.

The properties of the addition polymer film formed by laser ablation can be varied by changing the substrate temperature, laser fluence and partial pressure of the gaseous atmosphere. At a given laser fluence and pressure the thickness of the film onto a substrate decreases with increasing substrate temperature. At a given temperature and pressure the stoichiometry of the film varies with laser fluence. While the film formed from fluoropolymer targets is stoichiometric at fluences from about 0.5 to about 1.5 Joules/cm$^2$, the film becomes fluorine deficient at higher laser fluences.

A wide variety of substrates are useful in the present invention, the major requirement being that the substrate can withstand the temperatures and pressures of operation. Typical substrates are glass, quartz, potassium bromide, metals and silica. The addition polymer can also be deposited on porous silver, oriented and unoriented polyethylene and filter paper for membrane applications.

While this invention is not limited by any particular theory or explanation of operation, it is believed that addition polymer removal occurs via a thermal process in which photoabsorption rapidly heats the organic molecules to elevated temperatures causing bond cleavage and the onset of the pyrolitic decomposition of the polymer chains by an unzippering, or depolymerization reaction. Since the lower molecular weight products have a larger specific volume than the original sample material is ejected explosively to form a plume. This plume is believed to be composed of predominantly monomer and radicals. For example, when a fluoropolymer is the target, $CF_2^-$ and $C_2F_4^-$ radicals, as well as other low molecular weight products in an excited state may be present in the plume. However, it could also include higher molecular weight products up to and including the original sample material itself. The ejected monomer and other radicals in the presence of gases of choice, repolymerize on the substrate forming a thin film with preferably the stoichiometry of the starting material.

Fluoropolymers have long been known in the art for their antistatic and/or abrasion resistant properties and, as such, are useful as coatings for a variety of applications requiring these properties. Where ultrathin coatings are desired, such as coating surgical implants to render them abrasion resistant, coatings of thin fluoropolymer film prepared in a manner that retains the original composition/structure of the fluoropolymer, are especially useful.

Polyethylene, being a non-polar polymer, has similar uses to those of PTFE. Acrylates have been widely used in electronics for high resolution patterning, and the acrylate coatings obtained by the present invention can have the same utility.

Having briefly summarized the invention, the invention will now be described in detail by reference to the following specification and non-limiting examples. Unless otherwise specified, all percentages are by weight.

EXAMPLES 1-2

Two poly-tetrafluoroethylene films with appropriate compositions were deposited onto a KBr substrate by ablating a target of high molecular weight commercial polytetrafluoroethylene, Teflon ® T-60, in an Argon atmosphere. The ablation target was prepared by pressing 3 grs of Teflon ® T-60 in a ⅜" dye at 25,000 PSI and ambient temperature. Laser ablation was performed in a vacuum chamber at a background pressure of 1×10$^{-6}$ torr. The chamber was equipped with quartz windows to permit the transmission of a ultraviolet laser beam onto the target positioned at the center of the chamber. The laser beam angle of incidence was 45°. The target was ablated with the 266 nm 4$^{th}$ harmonic line of a Spectra-Physics DCR-11 Nd-YAG laser. The fourth harmonic and second harmonic lines were generated by pairs of dichroic mirrors at 45° incidence placed immediately outside the laser cavity. The overlapping fundamental, first harmonic and second harmonic lines were separated by a UV grade fused silica Pellin Broca prism placed about 5 inches away from the harmonic generation assembly. The beam was directed into the chamber by plane mirrors and focused into a 2 mm² spot by a lens placed at the entrance of the vacuum chamber. Uniform coverage of the substrate was assured by rastering the laser beam with a set of motorized micrometers placed on the last mirror mount. The fluence of the laser beam was for Examples 1 and 2, respectively, 0.5 Joules/cm²-pulse and 2 Joules/cm²-pulse in a 6–7 nanosecond pulse. The thin films were deposited onto a 13×2 mm KBr disk positioned 3 cm away from the target in the normal direction. The substrate temperature during deposition was that of ambient and the Argon pressure was maintained at 250 millitorr. Following the 45 min deposition, Argon was bled into the chamber until atmospheric pressure was reached. The thickness of each of the deposited films was about 1 μm. The X-ray photoemission spectroscopy for each Example are presented in Table 1, and indicate that the composition of the film of Example 1 is that of the original target Teflon ® and that the composition of the film of Example 2 is slightly fluorine deficient.

TABLE 1

| Example No. | % by weight of Carbon | % by weight of Fluorine |
| --- | --- | --- |
| 1 | 32.61 | 67.39 |
| 2 | 43.57 | 56.53 |

EXAMPLES 3–4

This example demonstrates the formation of Teflon AF 1600 ®, a commercially available copolymer of polytetrafluoroethylene and perfluoro-2,2-dimethyl-1,3-dioxol, films onto KBr substrates. The target was prepared by melt pressing commercial AF 1600 powder at 250° C. and 20,000 PSI onto a 2" square plate of 0.25" thickness. A ⅜" diameter disk cut from the above plate was used as the target. The deposition procedure was otherwise as described in Examples 1–2. The laser power used during the deposition was 1.2 Joules/cm². Sample S3 was deposited in vacuum. The chamber background pressure was maintained at $2 \times 10^{-5}$ torr. during deposition while sample S4 was deposited with an Argon background pressure maintained at 200 millitorr. The films were characterized by Fourier transform Infrared (IR) spectroscopy. The spectra of the ablated thin films of Teflon AF 1600 ® was measured and compared with a thin film of TEFLON AF 1600 ® powder prepared by spin coating and spray coating. The IR spectra of the ablated, spin coated and spray coated were substantially identical.

EXAMPLES 5–9

Five poly-tetrafluoroethylene films with the appropriate composition were deposited onto microscope slides by ablating a target of low molecular weight commercial poly-tetrafluoroethylene, Teflon ® P26-6026 in a CF₄ atmosphere as described in Examples 1–2. After deposition was completed the films were scraped from the plate onto a Differential Scanning Calorimetry (DSC) pan. The melting of the films during the first and second heatings of the film materials are summarized in Table 2.

TABLE 2

|  | $t^{m,1}$ | $t^{m,2}$ | $t^{c,2}$ | $\Delta Q^1$ | $\Delta Q^2$ | $\Delta Q^{c,2}$ | LP |
| --- | --- | --- | --- | --- | --- | --- | --- |
| P26-6026 | 327.5 | 329.8 | 21.5 | 67.4 | 63.1 | 12.5 | — |
| S5 | 325.1 | 326.5 | 19.9 | 54.9 | 59.8 | 7.1 | 1.5 |
| S6 | 325.8 | 325.7 | 19.7 | 55.5 | 52.9 | 8.7 | 1.12 |
| S7 | 325.3 | 325.6 | 19.6 | 54.6 | 59.6 | 7.0 | 0.96 |
| S8 | 325.7 | 326.3 | 20.0 | 67.4 | 63.1 | 12.2 | 0.8 |
| S9 | 326.1 | 326.7 | 20.5 | 67.3 | 63.1 | 12.3 | 0.36 |

$t^{m,1}$ is the melting temperature during the first heating of the sample (°C.)
$t^{m,2}$ is the melting temperature after having cycled the temperature once
$t^c$ temperature of the crystalline phase transition (not observed during the first heating of the films)
$\Delta Q^1$ heat flow during first melting (Joule/grams)
$\Delta Q^2$ heat flow during second melting (J/g)
$\Delta Q^c$ heat flow at crystalline phase transition (J/g) during second heating

EXAMPLE 10

A Teflon FEP ®, a commercially available copolymer of hexafluoropropylene and polytetrafluoroethylene, film with the appropriate composition was deposited onto a KBr disk by ablating a 0.005" thick commercial Teflon-FEP ® thick film in an Argon atmosphere at 0.5 Joules/cm² laser power as described in Examples 1–2. Infrared spectra show that the content of the film deposited onto the KBr disk had the same molecular content as the target.

EXAMPLE 11

A Teflon PFA ®, a commercially available copolymer of perfluoroalkoxy monomers and tetrafluoroethylene, film with the appropriate composition was deposited onto a KBr disk by ablating a 0.25" thick ⅜" disk melt pressed from commercial Teflon PFA ® powder in an Argon atmosphere with a laser power of 0.5 Joules/cm² as described in Examples 1–2. Infrared spectra show that the content of the film deposited onto the KBr disk had the same molecular content as the target.

EXAMPLES 12–13

Two films of poly-ethylmethacrylate (PEMA) were deposited on KBr and glass respectively by ablating a target of commercial PEMA, in an Argon atmosphere. The ablation target was prepared by pressing 2 grs of PEMA in a ⅜" dye at a pressure of 10,000 PSI for 5 minutes at a temperature of 116° C. The target was allowed to cool under pressure. Laser ablation was preformed in a vacuum chamber at a background pressure of $1 \times 10^{-6}$ torr. The chamber was equipped with quartz windows to permit the transmission of ultraviolet radiation onto a target positioned at the center of a chamber. The laser beam angle of incidence was 45°. The target was ablated with the 266 nm 4th harmonic line of a Spectra-Physics DCR-11 Nd-YAG laser. The 4th harmonic and 2nd harmonic lines were generated by pairs of dichroic mirrors at 45° incidence placed immediately outside the laser cavity. The overlapping fundamental, first harmonic and second harmonic lines at; 0.25 J/cm² in a 6–7 nanosec. pulse. The thin films were deposited onto a 13×2 mm KBr disk and a 25×25 mm microscope slide, respectively, positioned 3 cm away from the target material in the normal direction. The films were deposited at room temperature and the Argon pressure was maintained at 250 millitorr. during the deposition. Following a 30 minute deposition Argon was bled into the chamber until atmospheric pressure was reached. The IR spectra of the PEMA film ablated on KBr show a one to one correspondence with the IR spectra of PEMA. The second film was scrapped off the glass support in order to obtain a DSC spectra. The Tg (°C.) for the target was 67 and the Tg (°C.) for the film was also 67.

EXAMPLES 14-15

Two poly-butylmethacrylate (PBMA) films of the appropriate composition were deposited at room temperature onto a KBr substrate and a 10-10 mm microscope slide by ablating a target of commercial poly butyl methacrylate at 0.4 J/cm$^2$ laser fluence. The ablation target was allowed to cool under pressure and removed from the dye once ambient temperature was reached. After deposition was completed the infrared spectra of the ablated thin film on KBr was measured and compared with a thin film of PBMA that was bar coated from a 20% solid solution in methylene chloride. The IR spectra of the ablated and solution coated films were substantially identical.

After the deposition of the film on glass was completed it was scrapped of the plate onto a Differential Scanning Calorimetry pan. The glass transition temperature (Tg) of the ablated film was 28° C. and that of the target material was 27° C.

EXAMPLES 16-18

Three poly-methylmethacrylate (PMMA) films with the appropriate composition were deposited at room temperature onto KBr by ablating targets of low ($M_w$=5870), medium ($M_w$=67,000) and high molecular ($M_w \sim 10^6$) weights. The high molecular weight PMMA was Elvacite ® 2051, commercially available material. The ablation target for the low molecular weight material was prepared by pressing 2 grs of polymer in a ¾" dye at 25,000 psi and ambient pressure. The medium and high molecular weight targets were prepared by pressing 2 grs of the corresponding polymers in a ¾" dye at a pressure of 10,000 psi for 5 minutes at a temperature of 180° C. The targets were allowed to cool under pressure and removed from the dye once ambient temperature was reached. The laser power used during the deposition was 0.5 J/cm$^2$ for 30 minutes at a background pressure of 10$^{-5}$ torr. The films were characterized by Fourrier transform infrared spectroscopy (FTIR). The spectra of a thin PMMA film casted from a methylene chloride solution was measured and its thickness determined with a micrometer as well as with a Dektak ® profilometer. The IR spectra of the ablated and casted films were substantially identical. The thickness of the PMMA films ablated from the targets described above are summrized in Table 3. With the exception of the molecular weight of the target used for each film, the deposition parameters and process conditions were otherwise identical. The thicknesses of the ablated films were determined from the strength of the 3000 cm$^{-1}$ band in the corresponding IR spectra and the thickness and CH band absorption of the casted film.

TABLE 3

| Example No. | Target $M_w$ | 2950 cm$^{-1}$ band (%) | film thickness (μ) |
| --- | --- | --- | --- |
| 16 | 5,870 | 88.2 | 34.1 |
| 17 | 67,000 | 87.58 | 33.96 |
| 18 | 543,000 | 91.06 | 35.3 |
| casted | 543,000 | 58.2 | 22 |

EXAMPLES 19-20

Two poly-methylmethacrylate (PMMA) films of the appropriate composition were deposited onto a 13×2 mm KBr disk at ambient temperature and 173° C., respectively, by ablating an Elvacite 2051 target prepared as described in Example 18. The sample was resistively heated during the deposition. Good thermal contact was assured by anchoring the substrate onto the stainless steel heater assembly with silver paint. The temperature was measured using a Pt-Ir thermocouple position 1 mm away from the surface of the copper directly underneath the sample position. The samples were deposited at 0.25 J/cm$^2$ in an Argon atmosphere of 250 millitorr and at ambient and 173° C., respectively. After the deposition at ambient temperature was completed the sample was heated in air at 170° C. for 5 minutes. The later film, which was originally frosted, turned clear during heat treatment while the "as deposit" high temperature film was clear. Infrared characterization indicated that although the infrared spectral features were identical, the film ablated at ambient temperature was about 35μ thick while the one ablated at 173° C. was 9.7μ. The decrease in sample thickness with temperature reflects the strong temperature dependence of the polymerization rate. SEM photographs also reflect different surface morphologies. While the "as deposit" ambient temperature film shows that the ablated with film is fairly low density, it identifies during ehat treatment as refelected by featureless SEMs to a 1μ scale. In contrast, the film deposited at 173° C. is more densely packed.

EXAMPLES 21-23

Three polyethylene (PE) films of the appropriate composition were deposited onto KBr by ablating a target of 2000 molecular weight (PE2000) and one of commercial polyethylene (PE7140). The low molecular weight ablation target was prepared by pressing 2 grs of PE2000 in a ¾" dye at a pressure of 25,000 psi at ambient temperature. The high molecular weight target was prepared by pressing 2 grs of PE7140 in a ¾" dye at a pressure of 10,000 psi for 5 minutes at 120° C. and allowed to cool under pressure. The target was removed from the dye once ambient temperature was reached. One film was ablated from each of these targets at ambient temperature, with 1 J/cm$^2$ laser fluence and 250 millitorr Argon atmosphere for 30 minutes. Both films appeared slightly tan as would result from material with a small amount of conjugated carbon bonds. In contrast, the film ablated from the low molecular weight target at 0.4 J/cm$^2$ was white. After deposition was completed the infrared spectra of the three ablated thin film on KBr was measured and compared with a thin film of PE casted from solution. The IR spectra of all films were substantially identical. The X-ray photoemission spectra shows a peak at 285 eV that can be assigned to a carbon atom attached to two hydrogen atoms, indicating that the composition of the films is close to that of the original target. The melting temperatures of these films obtained by DSC analysis is presented in Table 4. The half width of the melting peak, extracted from the DSC spectra and the full width at half maximum (FWHM) of the XPS peak are listed in Table 4.

TABLE 4

| Sample No. | Target Material | Film | Laser Fluence | 284.5 ΔEb(eV) | FWHM (eV) | Tmelting (°C.) | ΔT(°C.) |
|---|---|---|---|---|---|---|---|
| 21 | PE2000 | Yes | 1 | 2.5 | 1.27 | 100 | 36.33 |
| 22 | PE7140 | Yes | 1 | 1.7 | 0.95 | 121.72 | 5.99 |
| 23 | PE2000 | Yes | 0.4 | 1.6 | 1.00 | 119.09 | 6.34 |
|  | PE2000 | Target | — |  | 0.96 | 126 | 10.41 |

ΔT = ½ width of melting peak.
ΔEb = ½ width of CH₂ XPS peak.

Other embodiments of the invention will be apparent to those skilled in the art from consideration of the specification, or from practice of the invention disclosed herein. It is intended that the specification and examples be considered as exemplary only, with the scope and spirit of the invention being indicated by the following claims.

What is claimed is:

1. A process for producing thin film of a first addition polymer on a substrate comprising: bombarding a target, consisting essentially of a second addition polymer, with radiation from a pulsed laser in a vacuum or gas atmosphere of gaseous fluorocarbon or inert gas to form a plume of components of said second addition polymer; and depositing said plume on the substrate, whereby a film of said first addition polymer is formed.

2. The process of claim 1 wherein the first addition polymer and second addition polymer are identical.

3. The process of claim 1 wherein the second addition polymer comprises one of the following:
   (i) fluoropolymer;
   (ii) alkylacrylic polymer; or
   (iii) polyethylene.

4. The process of claim 3 wherein the second addition polymer is fluoropolymer.

5. The process of claim 4 wherein fluorine substituents comprise at least 40% by weight of the second fluoropolymer.

6. The process of claim 5 wherein the second fluoropolymer comprises repeat units of a compound of Formula I,

wherein R¹, R², or R³ are independently selected from fluorine, hydrogen, chlorine, branched or straight chain alkyl, or fluoroalkyl of up to 10 carbon atoms, branched or straight chain alkoxy or fluoroalkoxy of up to 10 carbon atoms, branched or straight chain vinylether or fluorovinylether of up to 10 carbon atoms or ethylene copolymers thereof, and copolymers with the above repeat units.

7. The process of claim 6 wherein the second fluoropolymer is polytetrafluoroethylene, or a compound of Formula I wherein R¹, R², or R³ is perfluoromethyl; or a compound of Formula I wherein R¹, R², or R³ is perfluoropropylvinylether.

8. The process of claim 4 wherein the second fluoropolymer comprises one of the following copolymers:
   (i) polytetrafluoroethylene and perfluoro-2,2-dimethyl-1,3-dioxol;
   (ii) hexafluoropropylene and polytetrafluoroethylene; or
   (iii) perfluoroalkoxy monomer and tetrafluoroethylene.

9. The process of claim 4 wherein the laser is focused onto the target with a fluence of from about 0.4 Joules/cm² pulse to about 1.5 Joules/cm² pulse.

10. The process of claim 4 wherein said substrate is maintained at a temperature of from about −200° C. to about 325° C.

11. The process of claim 10 wherein said temperature is between ambient and about 20° C.

12. The process of claim 4 wherein the laser is focused onto the second addition polymer with a fluence of at least 0.25 Joules/cm²-pulse to about 1.5 Joules/cm²-pulse, the substrate is maintained at a temperature between about ambient and about 50° C. and the inert gas is argon under a pressure of about 25–250 millitorr.

13. The process of claim 3 wherein the second addition polymer is an alkylacrylic polymer.

14. The process of claim 13 wherein the alkylacrylic polymer comprises one of the following:
   (i) poly(methylmethacrylate);
   (ii) poly(ethylmethacrylate); or
   (iii) poly(butylmethacrylate).

15. The process of claim 13 wherein the laser is focused onto the target with a fluence of from about 0.1 Joules/cm² pulse to about 0.5 Joules/cm² pulse.

16. The process of claim 15 wherein the substrate is maintained at a temperature between about ambient and about 200° C. and the inert gas is argon under a pressure of about 25–250 millitorr.

17. The process of claim 3 wherein the second addition polymer is polyethylene.

18. The process of claim 17 wherein the laser is focused onto the target with a fluence of from about 0.4 Joules/cm² pulse to about 1.0 Joules/cm² pulse.

19. The process of claim 18 wherein the substrate is maintained at a temperature between about ambient and about 200° C. and the inert gas is argon under a pressure of about 25–250 millitorr.

20. The process of claim 3 wherein the second addition polymer is alkylacrylic polymer or polyethylene and the substrate is maintained at a temperature of from about ambient to about 200° C.

21. The process of claim 1 wherein the laser is focused onto the target with a fluence of from about 0.1 to about 3 Joules/cm² pulse.

22. The process of claim 1 wherein said atmosphere is under a pressure of about 25–250 millitorr.

23. The process of claim 1 wherein said inert gas is argon.

* * * * *